United States Patent [19]

Suzuki et al.

[11] Patent Number: 5,270,020
[45] Date of Patent: Dec. 14, 1993

[54] APPARATUS FOR MANUFACTURING SILICON SINGLE CRYSTALS

[75] Inventors: Makoto Suzuki; Masanori Ohmura; Shuzo Fukuda; Yoshinobu Shima; Takeshi Suzuki; Yasuhide Ishiguro; Iwao Ida, all of Tokyo, Japan

[73] Assignee: NKK Corporation, Tokyo, Japan

[21] Appl. No.: 862,337

[22] Filed: Apr. 2, 1992

[30] Foreign Application Priority Data

Apr. 15, 1991 [JP] Japan .................. 3-082109

[51] Int. Cl.$^5$ ............................................. C30B 15/22
[52] U.S. Cl. .................................. 422/248; 156/620.4; 422/249
[58] Field of Search ............... 156/617.1, 618.1, 619.1, 156/620.4, DIG. 64; 422/248, 249

[56] References Cited

U.S. PATENT DOCUMENTS

| | | | |
|---|---|---|---|
| 3,953,174 | 4/1976 | LaBelle, Jr. | 422/249 |
| 4,330,362 | 5/1982 | Zulehner | 422/249 |
| 4,416,723 | 11/1983 | Pelts et al. | 156/619.1 |
| 4,957,712 | 9/1990 | Shima et al. | 156/617.1 |
| 5,009,863 | 4/1991 | Shima et al. | 156/617.1 |
| 5,087,321 | 2/1992 | Kamio et al. | 156/DIG. 64 |

FOREIGN PATENT DOCUMENTS 62-241889  4/1986  Japan .
1153589  12/1987  Japan .
4010184  12/1987  Japan .

Primary Examiner—Olik Chaudhuri
Assistant Examiner—Felisa Garrett
Attorney, Agent, or Firm—Michael N. Meller

[57] ABSTRACT

A silicon single crystal manufacturing apparatus according to the CZ method which includes a partition member for dividing a quartz crucible into a single crystal growing section and a material melting section and having at least one small hole for permitting the passage of molten silicon, and a heat keeping cover for covering the partition member and the material melting section. The heat keeping cover is made of a sheet of metal selected from the group consisting of Ta, Mo and W and containing Fe 50 ppm or less and Cu 10 ppm or less. The metal sheet includes a surface layer composed of a silicon-enriched layer, and the depth of an area of the silicon-enriched layer in which the content of Si is greater than the contents of Fe and Cu at the same position therein is not less than 10 μm from the surface. The content of Fe in the silicon-enriched layer is not greater than 5 ppm. Thus, this is the apparatus for manufacturing silicon single crystals, being very low in oxidation induced stacking fault (OSF) density.

1 Claim, 2 Drawing Sheets

FIG. I

APPARATUS FOR MANUFACTURING SILICON SINGLE CRYSTALS

BACKGROUND OF THE INVENTION

1. Field of the Invention

The present invention relates to an apparatus for manufacturing large-diameter silicon single crystals by the Czochralski method (hereinafter referred to as a CZ method).

2. Description of the Prior Art

The silicon single crystals used in the field of LSIs have been generally manufactured the CZ method and in accordance with this CZ method the amount of molten silicon within the crucible is decreased with the growth of a silicon single crystal. Therefore, as the silicon single crystal grows, the dopant concentration in the silicon single crystal is increased and the oxygen concentration is decreased. In other words, the properties of the silicon single crystal varies along the direction of its growth.

Since the quality required for silicon single crystals has been becoming increasingly severe year after year along with the tendency toward increasing the level of integration of LSI's, problem has been caused that the yield is decreased correspondingly.

As a means of overcoming this problem, as for example, Japanese Patent Publication No. 40-10184 (P1, Right column, L20 to L35) discloses a method (the continuous CZ method) in which the interior of a quartz crucible of the CZ method is divided by a cylindrical or crucible-type quartz partition member having at least one small hole and a silicon single crystal is grown on the inner side (the single crystal growing section) of the partition member while feeding starting material silicon to the outer side (the material melting section) of the partition member.

As also pointed out by Japanese Laid-Open Patent No. 62-241889 (Page 2, Right Upper Column, L2 to L160), this method has a serious disadvantage that the molten silicon tends to be solidified starting at the partition member on the inner side of the partition member.

In other words, the solidification is caused at the portion where the surface of the molten silicon in the single crystal growing section is in contact with the partition member. This solidification grows toward the crucible central portion where the temperature is low thereby impeding the growth of the silicon single crystal. This is due to the following cases.

Since silica glass usually used as the partition member tends to pass heat radiation and since moreover there is a large heat radiation to the water-cooled furnace wall from the portion of the upper part of the partition member which is exposed above the surface of the molten silicon in the usual case, the heat in the molten silicon is transmitted upwardly through the partition member and the heat is radiated from the portion of the partition member which is exposed above the molten silicon surface. As a result, the molten silicon temperature is greatly decreased in the vicinity of the partition member.

In this way, the molten silicon surface contacting with the partition member is in a condition having an extremely high tendency toward causing the occurrence of solidification.

Recently, the manufacture of high-quality granular silicon has become possible and it is considered to be relatively easy to feed such granular silicon continuously into the molten silicon as the starting material silicon in the continuous CZ method.

However, when feeding the granular silicon onto the molten silicon surface, if a sufficient fusing heat is not imparted to the granular silicon, a part of the granular silicon is caused to remain unmelted. Then, it is not infrequent that solidification is caused from the unmelted part of the granular silicon and the solidification is spread.

This is caused by the fact that due to the difference in density, the solid granular silicon floats on the molten silicon surface, so that, since the emissivity of the solid granular silicon is greater than that of the molten silicon, the heat tends to be lost easily. Particularly, in case the granular silicon is attached and agglomerated to the partition member at the molten silicon surface in the material melting section, as in the case of the solidification in the single crystal growing section, the heat is rapidly lost through the partition member thereby tending to cause the occurrence and spreading of solidification.

In the future, if the amount of start in material supplied is increased along with increase in the diameter of silicon single crystals and increase in the pulling rate, this phenomenon tends to occur more frequently.

It is to be noted that this problem remains unchanged essentially even if the starting material silicon supplied is in any other form than the granular form.

Laid-Open Patent No. 1-153589 proposes a method which prevents the occurrence of solidification at the partition member and which prevents any part of the starting material silicon supplied from being left unmelted. This publication discloses that the partition member and the material melting section are covered with a heat keeping cover so that the radiation of heat to the water cooled furnace wall, etc., above the crucible is prevented and the temperature of the molten silicon around the partition member and in the material melting section is maintained.

Also, with a silicon single crystal manufacturing apparatus based on the conventional CZ method and having no partition member, etc., it is possible to increase the pull rate by using a cover of a shape different from the above-mentioned one.

While a variety of materials such as graphite and metals may be considered as suitable materials for the heat keeping cover, the studies by the inventors, have shown that graphite used generally as the material for the furnace components of the silicon single crystal furnace is high in emissity and therefore its heat keeping effect is not satisfactory. On the other hand, metals which are low in emissity are capable of efficiently preventing the radiation of heat so that they have high heat keeping effect and are well suited for the intended application of the heat keeping cover.

By constructing this heat keeping cover with a metal sheet, it is possible to ensure a stable pulling operation without causing the occurrence of solidification at the partition member and any unmelted part of the supplied starting material in the material melting section even in cases where large diameter silicon single crystals are pulled at high rates.

However, the heat keeping cover is intended for use in the high temperature environment within the single crystal pulling furnace and therefore it is necessary to be made of a high melting point metal such as tantalum, molybdenum or tungsten. Especially, tantalum is a metal which is excellent in malleability so that it can be easily worked in various ways and it is easy to use.

By thus covering the partition member with the heat keeping cover made of a material selected from the group consisting of a tantalum sheet, molybdenum sheet and tungsten sheet, it is now possible to prevent the molten silicon from solidifying at the partition member and prevent any part of the supplied starting material to be left unmelted in the material melting section, thereby making it stably grow a silicon single crystal according to the continuous CZ method.

However, it has been found out that the single crystal grown by using this metal-sheet heat keeping cover has a tendency toward increasing the density of the oxidation induced stacking fault (hereinafter referred to as an OSF) to about $10^3$ defects/cm$^2$, so that there is a problem from the crystal quality point of view.

SUMMARY OF THE INVENTION

The present invention has been made in view of the foregoing deficiencies in the prior art and it is the primary object of the invention to provide a silicon single crystal manufacturing apparatus which is free of OSF or extremely low in OSF density.

To accomplish the above object, in accordance with the present invention there is thus provided a silicon single crystal manufacturing apparatus including a quartz crucible for containing molten silicon, an electric resistance heater for heating the quartz crucible from its side, a quartz partition member adapted to divide the molten silicon into a single crystal growing section and a material melting section within the quartz crucible and having at least one small hole for permitting the passage of the molten silicon, a heat keeping cover for covering the partition member and the material melting section, a pressure reducing unit for reducing the pressure within the furnace accommodating the respective components, and a starting material feeder for continuously feeding starting material silicon to the material melting section, wherein the heat keeping cover is made of a sheet of metal selected from the group consisting of tantalum, molybdenum and tungsten and containing Fe 50 ppm or less and Cu 10 ppm or less, wherein the surface layer of the metal sheet is composed of a silicon-enriched layer, wherein the depth of its area where the silicon content is greater than the Fe and Cu contents is not less than 10 μm from the surface, and wherein the content of Fe in the silicon-enriched layer is not greater than 5 ppm.

DESCRIPTION OF THE PREFERRED EMBODIMENTS

Figure 1:
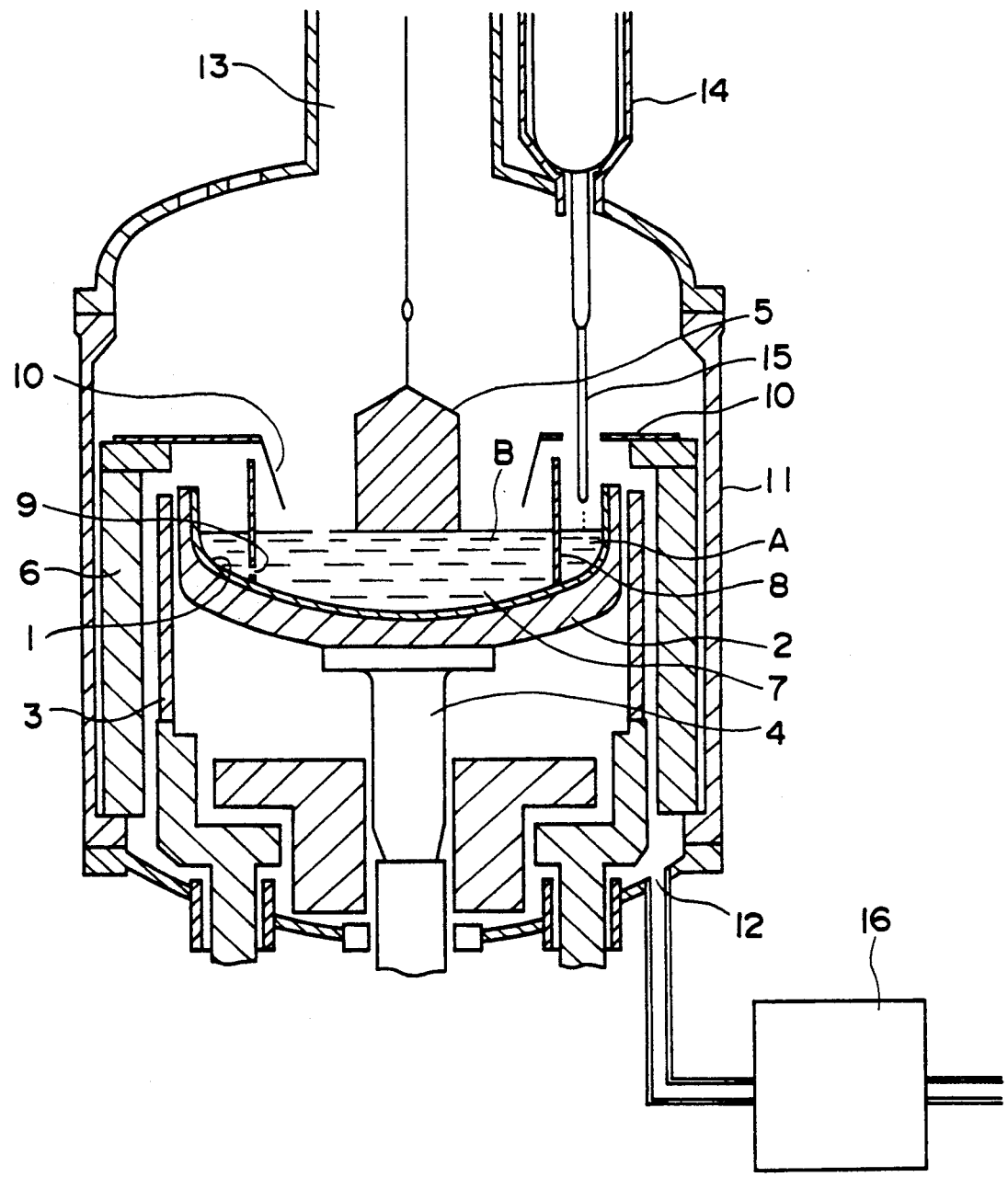
FIG. 1 is a longitudinal cross-sectional view showing schematically an embodiment of a silicon single crystal manufacturing apparatus according to the present invention.

In the first place, the inventors, studied on the cause of the high OSF density in the silicon single crystal grown by using the metal-sheet heat keeping cover according to the continuous pulling method as follows.

Firstly, since the effect of the thermal history of the crystal due to the presence of the heat keeping cover was considered as the cause of the OSF in the single crystal, single crystals were grown under various conditions modifying the construction, shape, etc., of the hot zone including the heat keeping cover within the single crystal pulling furnace for the purpose of varying the thermal history of the crystals. However, the density of OSF was not reduced in any of these cases.

Secondly, the impurity contamination of the single crystal was considered as the cause of occurrence of OSF. Since the melting into the molten silicon of the heavy metal impurity elements contained in the quartz crucible and the quartz partition member due to the melting of the quartz was conceived as a source of the contamination, single crystals were grown with varying the grade of the quartz (the amounts of the impurities contained were varied) and there was no change in the OSF density.

Further, single crystals were grown by the CZ method without using any quartz partition member and with supplying no starting material silicon but using the metal-sheet heat keeping cover and the resulting single crystals were also high in OSF density.

Then, as the results of the various studies, it was found out that the cause of the high OSF densities in the silicon single crystals grown by using the heat keeping cover resided in the fact that when the heavy metal impurities, e.g., Fe and Cu contained, though in trace amounts, in the metal sheet of the heat keeping cover were exposed to a high temperature environment of just above the molten silicon under the reduced pressures of 0.01 to 0.5 atmospheres, the impurities were evaporated, diffused by the vapor phase diffusion and deposited on the surface of the growing silicon single crystal and penetrated from the surface into the interior by solid phase diffusion, thereby causing metal contamination of the single crystal.

While it is not clear that the frequent occurrence of OSF is caused when the metal impurity contents of the single crystal amount to what extent, the contents of about $10^{10}$ atoms/cm$^3$ or less can be the cause of OSF.

The commercially available high-purity tantalum sheet which can be used for the heat keeping cover usually contains metal impurities such as Fe, Cu and Ni and it is said that their contents are Fe 50 ppm or less and Cu 10 ppm or less. The results of the analysis by the inventors, have shown that while the sheet inner part contains the metal impurities only in extremely trace amounts, e.g., Fe 10 ppm or less, and Cu 1 ppm or less, the metal impurities are enriched in the sheet surface layer, e.g., Fe 100 ppm or over and Cu 10 ppm or over.

It is considered that under the reduced pressure these metal impurities are exposed to a high temperature environment just above the molten silicon and are evaporated, diffused by the vapor phase diffusion, and deposited on the surface of a growing silicon single crystal and penetrated into the inner part from the surface by solid phase diffusion.

In this connection, it is considered that the constituent material of the heat keeping cover, i.e., tantalum itself is high in melting point, is not vaporized easily and is very low in diffusion rate in the silicon, with the result that it does not practically penetrate into the interior of the single crystal and there is no possibility of it becoming a contaminant causing the occurrence of OSF.

On the other hand, in the crystal growing temperature region the diffusion factors in silicon, of Fe, Cu, etc., are as high as $10^{-4}$ to $10^{-6}$ cm$^2$/s so that they tend to diffuse from the surface toward the interior of the single crystal and they become contaminants causing the occurrence of OSF.

The correctness of the studies by the inventors, is proved by the fact that the radial OSF density distribution of a silicon single crystal manufactured by using the commercially available tantalum sheet as a heat keeping cover coincides extremely well in pattern with the concentration profiles of such metals as Fe and Cu when the metals are subjected to solid-state diffusion.

The present invention is designed so that a silicon-enriched layer is formed in the surface portion of a metal sheet so that the vaporization of heavy metal impurity elements such as Fe and Cu from the metal sheet is reduced and the amounts of the heavy metal impurities entering into a silicon single crystal being grown are reduced.

This will be explained with reference to FIG. 2 relating to an embodiment of the present invention which will be described later.

Figure 2:
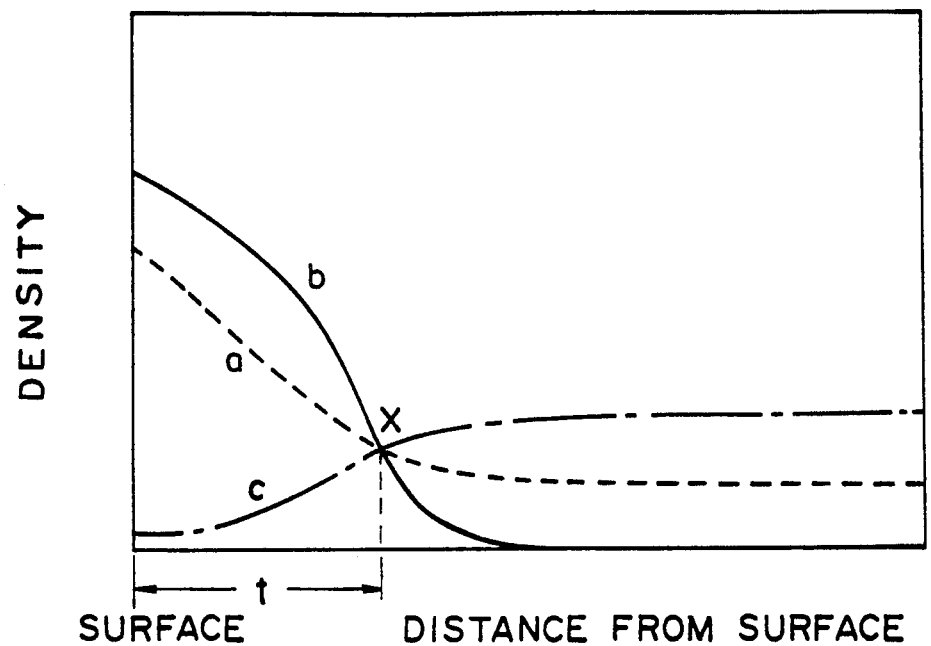
FIG. 2 is a graph showing schematically the concentration distribution profiles of the silicon and heavy metal impurity element (Fe) in the heat keeping cover metal sheet surface layer portion.

FIG. 2 is a graph schematically showing the concentration distribution profiles of silicon and a heavy metal impurity element (Fe) in the surface layer portion of a metal-sheet heat keeping cover, with the ordinate representing the concentration and the abscissa representing the depth from the surface. As shown in FIG. 2, while the heavy metal impurity content is greater than the silicon content on the right side of the point X of the depth t from the surface or on the inner layer side of the metal sheet, the silicon content is greater than the heavy metal impurity content on the left side of the point X or on the surface layer side of the metal sheet.

Assuming that t represents the depth of the point X from the metal sheet surface, by selecting the value of t to be 10 $\mu$m or over, the vaporization of the metal impurity from the metal sheet is reduced by means of Si.

The description will now be made with reference to the case in which the metal sheet is composed of a tantalum sheet and the heavy metal impurity is composed of Fe. The vaporization of Fe from the tantalum sheet surface can be considered in terms of a Ta-Fe system and the equilibrium vapor pressure of Fe contained in Ta is considered to be on the order of $10^{-6}$ atm.

On the contrary, where the silicon-enriched layer of the thickness t is in the tantalum sheet surface layer, it results in a Ta-Si-Fe system and therefore the activity of Fe in Ta is decreased due to the presence of Si. Thus, the vapor pressure of Fe becomes $10^{-8}$ atm or less and the amount of Fe vapor from the tantalum sheet is decreased considerably. However, if the thickness t of the silicon-enriched layer is not greater than 10 $\mu$m, the metal impurity vaporization preventive effect is not satisfactory.

It is needless to say that lower the heavy metal impurity content of the silicon-enriched layer is, it is more advantageous for the purpose of reducing the vaporization of the heavy metal impurity.

If the content of the heavy metal impurity, e.g., Fe in the silicon-enriched layer is reduced to 5 ppm or less, the heavy metal impurity is completely prevented from being vaporized. In FIG. 2, the curve c shows the heavy metal impurity distribution obtained as the result of the processing for reducing the heavy metal impurity in the surface layer.

It is to be noted that while the tantalum sheet frequently contains molybdenum, tungsten, etc., as impurities, these high melting-point metal elements of over 2000° C. in melting point are not easily vaporized and moreover their rates of diffusion in the silicon are extremely low. Thus, even if these metal elements are contained as impurities in the tantalum sheet, their possibility of becoming contaminants of the silicon single crystal is not great.

From the foregoing it will be seen that to accomplish the object of the present invention there is thus provided a metal sheet for the heat keeping cover of a silicon single crystal manufacturing apparatus and the metal sheet is made of a material selected from the group consisting of tantalum, molybdenum and tungsten and containing Fe 50 ppm or less and Cu 10 ppm or less. The surface layer of the metal sheet is composed of a silicon-enriched layer and it is limited such that the depth from the surface of an area where the silicon content is greater than the Fe and Cu contents at the same position in the silicon-enriched layer is not less than 10 $\mu$m and that the Fe content of the silicon-enriched layer is not greater than 5 ppm.

Methods of forming the silicon-enriched layer in the metal sheet surface layer include for example the evaporation of silicon on the metal sheet and the heat treatment of the metal sheet in a gas containing silicon or SiO.

Also, while included among the methods of reducing the heavy metal impurity contents of the metal sheet surface layer is one which heats the metal sheet under the application of a reduced pressure, so far as the requirements of the present invention are satisfied, there still is the OSF reducing effect, even if the heavy metal impurity contents are not rather positively reduced and the metal sheet is used as such.

In accordance with the silicon single crystal manufacturing apparatus of the invention construction in the above-mentioned manner, it is now possible to stably manufacture a high-quality large-diameter silicon single crystal having a diameter of 6 to 10 inches and an OSF density of not greater than 10 defects/cm$^2$ while feeding starting material silicon in an amount corresponding to the single crystal pulling rate but without the occurrence of any solidification at the partition member at the molten silicon surface and the occurrence of any unmelted left-over of the starting material silicon supplied.

Further, in the manufacture of silicon single

Further, in the manufacture of silicon single crystals according to the conventional CZ method, the silicon single crystal manufacturing apparatus of the present invention can ensure the stable manufacture of high-quality large-diameter silicon single crystals having OSF densities of not greater than 10 defects/cm$^2$ while realizing the desired speed-up of the pull rate.

A preferred embodiment of the present invention will now be described in detail with reference to the accompanying drawings.

Referring to FIG. 1, there is illustrated a longitudinal cross-sectional view schematically showing a silicon single crystal manufacturing apparatus used in an embodiment of the present invention.

In FIG. 1, numeral 1 designates a quartz crucible having a diameter of 20 inches and supported on a graphite crucible 2 which in turn is supported on a pedestal 4 with rotatable mechanism.

Numeral 3 designates an electric resistance heater surrounding the graphite crucible, 5 a silicon single crystal, and 6 a heat insulating material surrounding the electric resistance heater 3, with these components being accommodated with a chamber 11. Numeral 7 designates the molten silicon (the amount of molten silicon is 25 Kg) contained within the quartz crucible 1 so that the silicon single crystal 5 is pulled from the molten silicon 7.

In this embodiment, the silicon single crystal is a P-dope type (N-type) having a resistance value of 10 Ωcm, a diameter of 6 inches and its pull rate is 1.2 mm/min on an average.

An atmosphere gas (argon gas) is introduced into the furnace through a gas inlet (not shown) provided in the upper part of a pulling chamber 13 and it is discharged through an outlet port 12 in the furnace bottom by a pressure reducing unit 16. The pressure within the furnace is 0.02 atmospheres.

The foregoing is all the same with the conventional silicon single crystal manufacturing apparatus according to the ordinary Czochralski method.

Numeral 8 designates a partition member of 16 inches in diameter which is made of high-purity quartz and arranged within the crucible 1 to have the common axial center therewith.

The partition member 8 is formed with at least one small hole 9 of 3 mm in diameter so that the molten silicon in a material melting section A (on the outer side of the partition member 8) flows into a single crystal growing section B (on the inner side of the partition member 8) through the small hole 9.

The upper portion of the partition member 8 is exposed above the molten silicon surface and the lower edge portion is preliminarily fused to the quartz crucible 1 or alternatively it is fused by the heat produced when preparing the molten silicon by melting the starting material during the initial period.

Granular silicon is introduced into a starting material feed pipe 15 from a storage hopper (not shown) within a starting material feed chamber 14 through a feeder unit (not shown), thereby continuously feeding the granular silicon to the material melting section A. The feed rate is constant at about 55 g/min which is equal to the single crystal pull rate from the single crystal growing section B.

It is to be noted that in accordance with the present invention, though not shown, there are of course provided control means for positively controlling the temperature of the material melting section A and the single crystal growing section B, single crystal pulling and rotating means, crucible rotating means and atmosphere gas supply means.

Also, in order to maintain constant the concentration of the molten silicon, a dopant is fed suitably, along with the granular silicon, through the same starting material feed pipe 15.

Numeral 10 designates a heat keeping cover made of a high-purity tantalum sheet of 0.2 mm, thick. The silicon and Fe contents are respectively 50 ppm and 1 ppm at the surface, and the silicon content is greater than the Fe content and the Cu content within the extent of 20 μm from the surface.

Referring now to FIG. 2, there is illustrated a graph showing concentration distribution profiles of the silicon and the heavy metal impurity element (Fe) in the surface portion of the heat keeping metal sheet cover, with the ordinate representing the concentration and the abscissa representing the distance from the surface. The curve a shows the concentration distribution of the heavy metal impurity in the metal sheet, the curve b shows the silicon concentration distribution in the metal sheet surface layer, and the curve c shows the heavy metal impurity distribution when a processing for reducing the heavy metal impurity in the surface layer was performed.

In other words, in the surface layer portion of the heat keeping cover made of the tantalum metal sheet in which the heavy metal impurity (Fe) has a concentration distribution such as shown by the curve a in FIG. 2, the silicon-enriched layer is formed from the surface with a silicon concentration distribution such as shown by the curve b in FIG. 2.

While the heavy metal impurity content is greater than the silicon content on the right side of the point X of a depth t from the surface layer in FIG. 2, the silicon content is greater than the heavy metal impurity content on the left side of the point X (on the surface layer side).

If t represents the depth of the point X from the metal sheet surface, the vaporization of the metal impurity from the metal sheet can be reduced by selecting the value of t to be 10 μm or over.

A silicon single crystal was manufactured according to the continuous CZ method by a silicon single crystal manufacturing apparatus such as shown in FIG. 1 and employing the tantalum metal sheet having concentration distribution shown by the curves of FIG. 2.

Silicon wafers were produced from this silicon single crystal and after a heat treatment was performed on the wafers at 800° C. for 3 hours and then at 1000° C. for 15 hours in a dry $O_2$ atmosphere (for quality evaluation purposes), their OSF densities were measured showing the densities of 2 to 9 defects/cm².

Further, using the heat keeping cover 10 of a tantalum sheet having a different thickness t, as measured from the tantalum sheet surface, of the area in which the Si concentration was greater than the metal impurity concentration, a silicon single crystal was grown in the same manner as mentioned previously and the same heat treatment as mentioned above was performed for quality evaluation purposes, thereby measuring the OSF densities. The results obtained are shown in FIG. 3.

Figure 3:
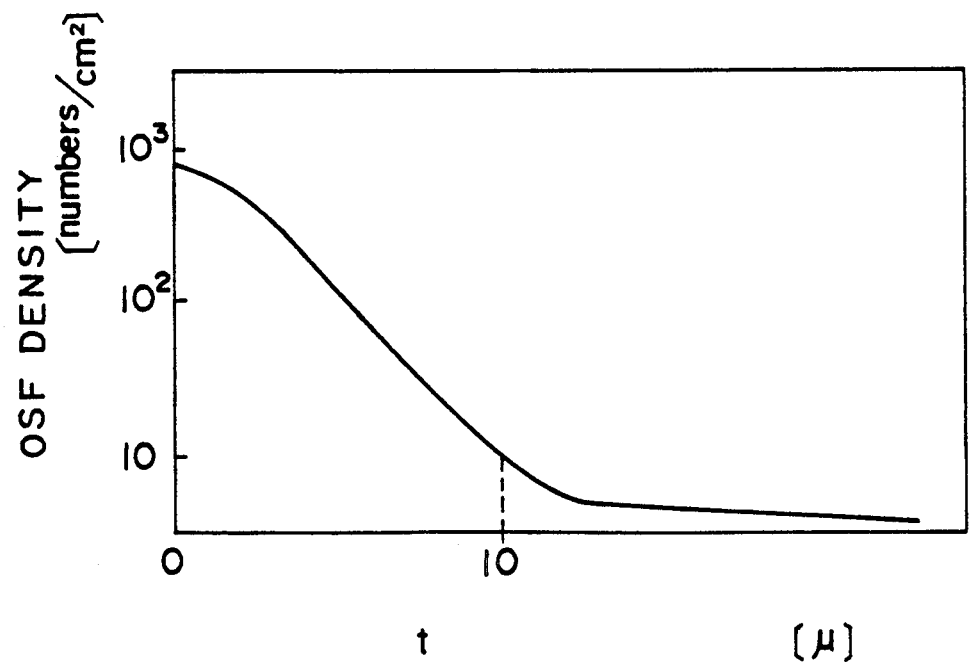
FIG. 3 is a graph showing the relation between the thickness t of the silicon-enriched layer in the heat keeping cover metal (tantalum) sheet surface layer portion and the OSF density (in-surface average value) of a silicon single crystal.

FIG. 3 is a graph showing the relation between the thickness t of the silicon-enriched layer in the metal (tantalum) sheet surface layer portion of the heat keeping cover and the OSF density (defect/cm², insurface average value per silicon wafer).

As shown in FIG. 3, where the thickness t of the silicon-enriched layer in the metal sheet surface is not greater than 10 μm, the OSF of $10^1$–$10^3$ defects/cm² were present. On the contrary, where the thickness t of the silicon-enriched layer in the metal sheet surface layer was greater than 10 μm, the resulting OSF densities were not greater than 10 defects/cm².

We claim:

1. In a silicon single crystal manufacturing apparatus comprising:
    a quartz glass crucible for containing molten silicon;
    a quartz glass partition member for dividing said molten silicon into a single crystal growing section; and a material melting section within said quartz glass crucible;

said partition member having at least one small hole for permitting said molten silicon to flow therethrough;

a heat keeping cover consisting of a disk-like member having a round opening at its center and a hole for introducing said granular silicon or chunk of silicon and a cylindrical or funnel-shaped member connected to an inner periphery of said opening extending downward vertically or slope-wise toward the center, covering only the surface of said molten liquid in a raw materials melting area and the top and the inner side of said partition projecting above the surface of molten liquid;

said heat keeping cover is made of a sheet of metal selected from the group consisting of tantalum, molybdenum and tungsten and containing Fe 50 ppm or less and Cu 10 ppm or less and a starting material feeder for continuously feeding silicon to said material melting section;

wherein a surface of said metal sheet is composed of a silicon-enriched layer, wherein the thickness of said silicon-enriched layer is not less than 10 $\mu$m in which a silicon content is greater than Fe and Cu contents at the same position and wherein the Fe content of said silicon-enriched layer is not greater than 5 ppm.

* * * * *